US006893326B2

United States Patent
Tyldesly

(10) Patent No.: US 6,893,326 B2
(45) Date of Patent: May 17, 2005

(54) COATING REMOVAL

(75) Inventor: Frank Tyldesly, Cambridge (GB)

(73) Assignee: Cambridge Consultants Limited, Cambridge (GB)

( * ) Notice: Subject to any disclaimer, the term of this patent is extended or adjusted under 35 U.S.C. 154(b) by 0 days.

(21) Appl. No.: 10/363,588

(22) PCT Filed: Aug. 22, 2001

(86) PCT No.: PCT/GB01/03789

§ 371 (c)(1),
(2), (4) Date: Aug. 15, 2003

(87) PCT Pub. No.: WO02/21882

PCT Pub. Date: Mar. 14, 2002

(65) Prior Publication Data

US 2004/0014397 A1 Jan. 22, 2004

(30) Foreign Application Priority Data

Sep. 4, 2000 (GB) .............................. 0021747

(51) Int. Cl.⁷ ................................ B24B 7/20
(52) U.S. Cl. ........................... 451/28; 451/29
(58) Field of Search ...................... 451/28–31; 156/344, 156/345.19, 345.3

(56) References Cited

U.S. PATENT DOCUMENTS 3,808,751 A * 5/1974 Usui ........................... 451/31
4,232,059 A 11/1980 Proffitt
4,288,269 A * 9/1981 Batiuk ........................ 156/344
6,067,139 A * 5/2000 Bohm et al. ................ 349/123
6,099,388 A * 8/2000 Fritsch et al. ................. 451/28
6,477,759 B2 * 11/2002 Hu ............................ 29/527.2
6,561,872 B2 * 5/2003 Farmer et al. ................ 451/29
6,699,356 B2 * 3/2004 Bachrach et al. ...... 156/345.21

FOREIGN PATENT DOCUMENTS

| GB | 1 601 753 | | 11/1981 | |
|---|---|---|---|---|
| JP | 55065072 A | * | 5/1980 | ............. B24C/1/04 |
| JP | 57138563 A | * | 8/1982 | ............. B24B/1/00 |

OTHER PUBLICATIONS

Patent Abstracts of Japan, vol. 014 No. 314.

* cited by examiner

Primary Examiner—David B. Thomas
(74) Attorney, Agent, or Firm—Alix, Yale & Ristas, LLP

(57) ABSTRACT

An indium tin oxide (ITO) coating is selectively removed from a substrate by printing a mask on the coated surface of the substrate to cover those regions of the surface on which the ITO is to remain. The substrate is then abraded to remove the ITO from the unmasked regions of the surface and the mask is removed with a solvent. The method provides quick and accurate removal of ITO without the use of acids or lasers.

10 Claims, No Drawings

COATING REMOVAL

BACKGROUND OF THE INVENTION

The present invention relates to a method of removing a surface coating, in particular to a method of removing an indium tin oxide coating from a substrate for an electroluminescent display.

Electroluminescence is the emission of light by a material when subjected to an electric field.

A typical thick film phosphor electroluminescent device comprises a layer of electroluminescent material in a dielectric matrix, sandwiched between two planar conducting electrodes. The electroluminescent material comprises phosphor particles, typically a zinc sulphide (ZnS) powder doped with manganese (Mn), microencapsulated in a dielectric material. Typically, silver- or graphite-loaded screen-printable inks, and indium tin oxide (ITO), a transparent conductive material, respectively are used to form the electrodes on a substrate such as a polyester film. When an AC voltage is applied between the electrodes, the electroluminescent material emits light.

The inventors have recently developed thick film electroluminescent displays in which a plurality of shaped independent electrodes are provided on at least one side of a layer of electroluminescent material. A voltage may be applied selectively to each of these independent electrodes to illuminate a respective region of the display. A thick film electroluminescent display is created by selecting the configuration of the independent electrodes to represent information, for example in the form of a seven-segment display or the like.

A problem associated with the manufacture of thick film electroluminescent displays is that the independent electrodes must be connected electrically to a voltage source for the display. In a convenient manufacturing technique, electrical connections are applied as conductive tracks on the rear surface of the device, for example by screen printing conductive ink. However, when a voltage is applied to the conductive tracks, they can act as electrodes causing the electroluminescent material to illuminate. Such illumination is undesirable as it detracts from the clarity of the display.

One way to prevent unwanted illumination due to the conductive tracks is to remove the ITO from the substrate in the regions opposite the conductive tracks. The ITO should be removed completely and in register with the other layers of the display.

Commercially available materials suitable for use as substrates in electroluminescent displays can have very resilient coatings of ITO. The manufacturers of such materials recommend the use of an acid for etching away the unwanted areas of the ITO coating. According to the recommended process, the coated substrate is initially provided with an etching mask, which is typically alkali soluble, and the substrate is immersed in acid, for up to 20 minutes, depending on the grade of ITO. The substrate is then rinsed and the mask is removed with an alkali solution. The process is messy, and difficult to control.

An alternative method of removal is laser ablation of the ITO layer. However, this method is slow because the laser is scanned across the surface of the substrate, and the process can take a very long time where ITO is to be removed from a relatively large area.

SUMMARY OF THE INVENTION

The present invention provides a method for selectively removing a surface coating, in particular an indium tin oxide (ITO) coating, from a substrate, the method comprising:

providing a substrate having a coated surface;

applying a mask to the coated surface to cover those regions of the surface on which the coating is to remain; and abrading the substrate to remove the coating from the unmasked regions of the surface.

The inventor has found that abrasion of the masked substrated provides a quick, accurate and relatively simple method of removing a coating such as ITO from a substrate, in which it is not necessary to use hazardous chemicals such as acids or expensive and slow laser equipment.

The substrate may be any suitable material, for example a plastics film, in particular a transparent plastics film. In the preferred embodiment, the substrate is a polyester or polyethylene teraphthalate (PET) film.

The coating may be any suitable coating. In the preferred embodiment, the coating is indium tin oxide (IYO) but other transparent conductive coatins, such as gold and silver, may also bus used in the context of the invention.

Advantageously, the mask is printed, for example screen printed, onto the substrate. In the production of electroluminescent displays, the layers of conductive, insulating and electroluminescent material may be screen printed onto the substrate. Thus, the mask may be printed in the same way, so that registration of the mask can be assured in the same way as for the other layers.

After the coating has been abraded, the mask may be removed, for example with a solvent. However, it is not necessary for the mask to be removed. For example, it would be possible for the mask to be constituted by one or more of the layers of the electroluminescent display. In this case, abrasion would take place after the relevant layer had been applied to the substrate.

The coating may be abraded in any suitable manner, for example using rotary brushes or the like. In the case of a flexible substrate, the substrate may be held during abrasion by suitable means such as a rigid vacuum bed a vacuum conveyer. Rotary or oscillating brushes may be used, in combination with abrasive media, such as pumice, silicas, aluminium oxide, glass powder, diamond slurry, etc.

Abrasive pads may be used for abrading the coating. In particular, pads of Scotchbrite (trade mark) material have been found to be particularly effective. In one trial, a flap roller (a cylinder made up of a large number of sheets of abrasive material) was found to be very successful. The abrassive pads and/or brushes can be used wet or dry. A further alternative for abrading the coating is a sanding belt, flat disc or similar device.

The abrasion may be carried out in more than one step or by more than one method. For example, a sequence of the above described abrasion methods may be used, possibly with a fine abrasion process following a coarse abrasion process. The abrasion devices may operate at different angles, for example two rollers at 45 degrees along the length of the machine.

In the case of an electrically conductive coating, it is not necessary for the coating to be completely removed, provided that it is sufficiently disrupted in the unmasked regions to prevent its effective operation as a conductor. Thus, the abrasion step may be chosen to score or grain the conductive coating to break up the conductive pathways through the conductor. In one particular arrangement, the graining may be carried out in two directions to form isolated squares or diamonds of the coating on the substrate.

DETAILED DESCRIPTION OF THE PREFERRED EMBODIMENT

A specific, non-limiting example of a process according to an embodiment of the invention will now be described for the purposes of illustration only.

EXAMPLE

A sample of transparent polyethylene teraphthalate (PET) film coated with indium tin oxide (ITO) produced by CP Films, Inc. of Martinsville, Va., USA as Courtaulds OC 80 film (sheet resistance 80 ohms square) was abraded in accordance with the invention. A mask of XV 1000 UV-curing etch resist blue, available from Coates Electrographics of Bath, UK, was screen printed onto the film and cured.

The masked film was passed twice under a rotating flap roller of Scotchbrite CPFB AMED material available from 3M of St. Paul, Minn., USA, at a brush speed of 14 m/s, a feed speed of 2 m/s and a lateral oscillation rate of 200 cycles per minute.

The ITO coating was completely removed in the unmasked areas without damaging the etch resist. The surface of the PET was lightly grained by the abrasion, but this is not a disadvantage of the process, as the areas in which the ITO is removed are generally masked by a print overlay in the electroluminescent device.

The etch resist was removed by wiping with a dilute sodium hydroxide solution.

The processing of the film according to this example is relatively cheap and quick, because the processing speed is unaffected by the amount of ITO that must be removed.

As an alternative to the flap roller, a large diameter Scotchbrite pad could be used to abrade the ITO coating. Timesavers International BV of Goes, The Netherlands make a machine under the designation Grindingmaster that is able to use a 900 mm diameter pad.

In summary, an indium tin oxide (ITO) coating is selectively removed from a substrate by printing a mask on the coated surface of the substrate to cover those regions of the surface on which the ITO is to remain. The substrate is then abraded to remove the ITO from the unmasked regions of the surface and the mask is removed with a solvent. The method provides quick and accurate removal of ITO without the use of acids or lasers.

What is claimed is:

1. A method of producing an electroluminescent display in the form of an electroluminescent layer sandwiched between a substrate and a plurality of independent electrodes and conductive tracks for activating the electroluminescent layer, the method comprising the steps of:

providing a transparent conductive coating over a surface of the substrate;

applying a mask to the coated substrate surface to cover regions of the surface on which the conductive coating is to remain and to leave bare those regions of the coating which are in register with the conductive tracks; and removing by abrasion the coating where the mask is not present.

2. A method as claimed in claim 1, wherein the abrasion is conducted by mechanical rubbing means.

3. A method as claimed in claim 2, wherein the abrasion is conducted with abrasive pads.

4. A method as claimed in claim 3, wherein the abrasive pads form a flap roller.

5. A method as claimed in claim 2, wherein the abrasion is conducted with a flat disc.

6. A method as claimed in claim 1, further comprising sufficiently removing the coating of the unmasked region to the extent necessary to prevent the coating from operating as a conductor.

7. A method as claimed in claim 1, further comprising completely removing the coating from the unmasked region.

8. A method as claimed in claim 1, further comprising printing the mask onto the substrate.

9. A method as claimed in claim 1, further comprising the step of removing the mask.

10. A method as claimed in claim 9, further comprising removing the mask with a solvent.

* * * * *